United States Patent [19]

Garboushian

[11] 3,833,753

[45] Sept. 3, 1974

[54] HERMETICALLY SEALED MOUNTING STRUCTURE FOR MINIATURE ELECTRONIC CIRCUITRY

[76] Inventor: Vahan Garboushian, 3905 Mesa St., Torrance, Calif. 90505

[22] Filed: Nov. 30, 1972

[21] Appl. No.: 310,820

[52] U.S. Cl. ............ 174/525, 174/50.56, 317/234 G

[51] Int. Cl. ............................................. H05k 5/00

[58] Field of Search .......... 174/DIG. 13, 525, 50.52, 174/50.54, 50.56, 50.6, 50.61, 50.63; 317/234 G, 101 CP, 101 R

[56] References Cited

UNITED STATES PATENTS

| | | | |
|---|---|---|---|
| 2,976,465 | 3/1961 | Jensen | 174/525 X |
| 3,020,454 | 2/1962 | Dixon, Jr. | 174/525 X |
| 3,234,438 | 2/1966 | Glickman | 174/525 X |
| 3,312,771 | 4/1967 | Hessinger et al. | 174/525 |
| 3,320,351 | 5/1967 | Glickman | 174/50.5 |
| 3,379,823 | 4/1968 | Loose | 174/50.61 |
| 3,444,619 | 5/1969 | Lomerson | 174/525 X |

*Primary Examiner*—Darrell L. Clay
*Attorney, Agent, or Firm*—Smyth, Roston & Pavitt

[57] ABSTRACT

A mounting and hermetically sealing and encapsuling structure for miniature electronic circuit elements which are supported on ceramic carrier wafers or the like; a base element is used, made of a material of high thermal conductance to serve as heat sink and having an integral flat bar along one side, the flat bar has windows in which are mounted lead-in support members each constructed from a ceramic wafer element with peripheral metallization on one side and several metallized apertures with current leads therein, metallization islands surround the apertures on one side, and the metal leads in the apertures are respectively connected to the metallization islands. External leads on the other side of the wafer are cemented thereto as well as connected to the leads in the apertures, the external lead, the internal lead, the metallization lining and the island being in metallic contact including metallic sealing from one side of the wafer element to the other side. A cover is riveted to the end portions of the base element.

6 Claims, 12 Drawing Figures

HERMETICALLY SEALED MOUNTING STRUCTURE FOR MINIATURE ELECTRONIC CIRCUITRY

BACKGROUND OF THE INVENTION

The present invention relates to hermetically sealed mounting structure for miniature electronic circuitry as provided, for example, on ceramic wafers or the like; the circuitry may be described as mini circuit boards, analogous to PC cards, but of smaller dimensions.

Quite frequently, such electronic circuitry must be mounted in hermetically sealed encapsulation but on a relatively powerful heat sink, which is necessarily made of metal. The problem arises to provide adequate current lead facilities, leading into the space that is to be, and is to remain, hermetically sealed. It is an object of the present invention to solve that problem in an inexpensive manner.

DESCRIPTION OF THE INVENTION

In accordance with the preferred embodiment of the invention, it is suggested to provide a rather solid, thick, and preferably metallic base to serve as heat sink and having a mounting platform around which encapsulation is to be provided for. The base has an integral, rather flat bar-like extension which is provided with windows. Peripherally metallized ceramic wafers are soldered to the base-bar material around the windows to provide metal-to-metal seal. The wafers have one or more metallized apertures which receive current leads projecting into the space above the platform. The apertures each are surrounded with metallization islands to which the leads are soldered. External current leads are cemented to the wafers on the other side and are metallically bonded (e.g. soldered) to the metallization and/or leads of and in the apertures. A sealing gasket has been placed onto the mounting platform, along the periphery thereof, whereby the said current leads project into the space thusly enclosed. A cover is secured, preferably rivited to the base for sealing said space. The electronic circuitry with mounting wafers or the like have been placed onto the platform prior to sealing, and electrical connections have been made between the circuitry involved here and the current leads. Thereafter, these elements are hermetically sealed.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 illustrates a completed assembly for an encapsuled and hermetically sealed, miniature electronic device. The assembly is depicted approximately on a 1:1 scale, and includes a copper base 10 with a cover 11 riveted to the base. One long side of base 10 has a narrow projection or ledge 12 extending over the entire length of the base, and current leads 13 are seen to project from the underside of the base as depicted.

Figure 1:
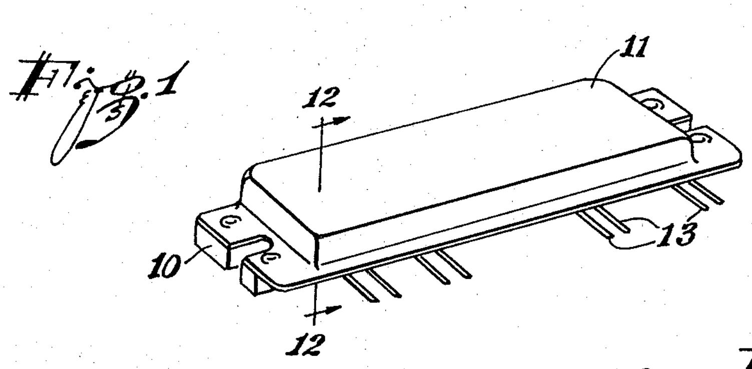
FIG. 1 is a perspective view of a completely assembled and hermetically sealed mounting and encapsulating structure in accordance with the preferred embodiment of the invention.

The base element 10 is more particularly illustrated in FIGS. 5 through 9. Base 10 is flat and includes a mounting platform 14 for miniature printed circuit boards, e.g., with ceramic carrier wafers, metallization as circuit connections thereon and provides for mounting and interconnecting miniature electronic components. This particular platform area is circumscribed by a shallow groove 15 for stopping the flow of solder when the carrier wafers are mounted on platform 15, and when circuit connections are made among them as well as to leads to be described.

Rivets 16 are provided outside of that area, which rivets have been worked out of the base by extrusion. The ledge portion or bar 12 has a plurality of (in this case, four) windows or apertures 17. Base 10 is quite flat and smooth, directly outside of and along groove 15 as well as adjacent windows 17, so that a rectangular sealing gasket can be overlaid, circumscribing space above platform 14 that can be hermetically sealed.

Figure 2:
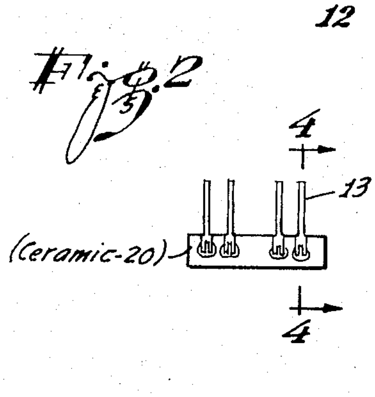
FIGS. 2 and 3 are respectively top and bottom views of wafers with current leads that are to provide for running hermetically sealed leads from the outside to the inside of the encapsulation.
Figure 4:
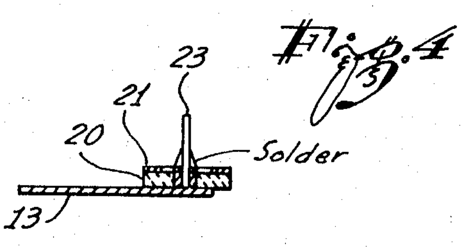
FIG. 4 is a section view along lines 4—4 in FIGS. 2 and 3.
Figure 3:
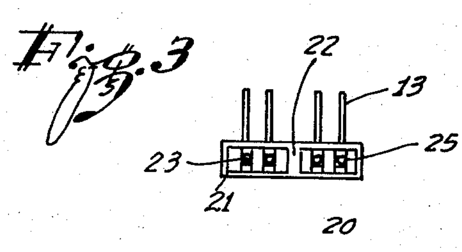
Figure 5:
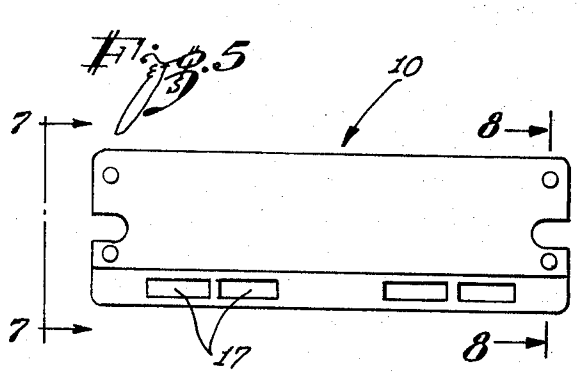
FIGS. 5 and 6 are respectively bottom and top views of the heat sink base and mounting platform.
Figure 6:
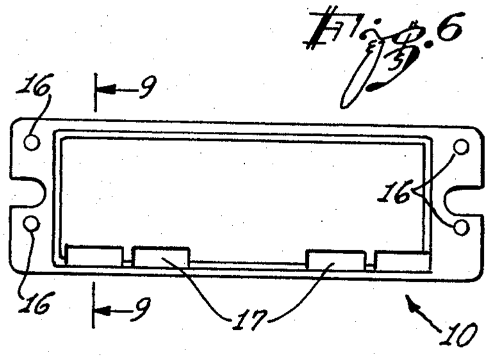
Figure 7:
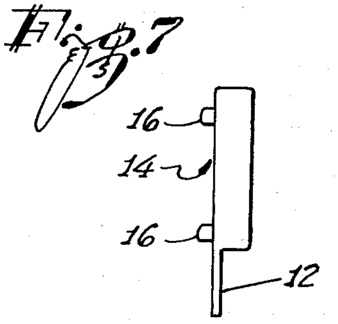
FIGS. 7, 8 and 9 are section views respectively as indicated by lines 7—7; 8—8 and 9—9 in FIGS. 5 and 6.
Figure 8:
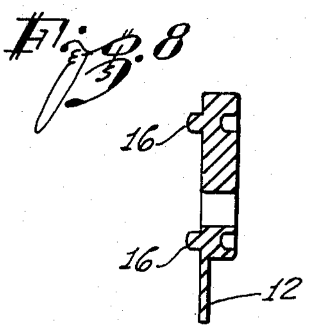
Figure 9:
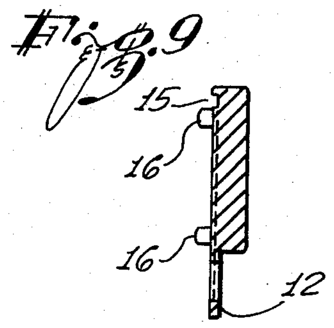

Lead-in elements for electric current are needed, and they are prepared as shown more fully in FIGS. 2, 3 and 4. The lead-in elements each comprise a small ceramic wafer 20 which is metallized on one side around its periphery 21 with a central dividing "line" 22. Central areas of the wafer leave the ceramic exposed on both flat sides. Each wafer has four apertures which are metallized also and are passed through by short internal leads 23. These leads are respectively soldered to the externally accessible leads 13 on one side of the wafer (FIGS. 2 and 3), thereby covering the respective aperture. The other side of the wafer (FIG. 3) is provided with metallization islands 25 on the ceramic around each aperture, but the islands are separated from each other as well as from metallization rim 21. Each lead 23 is soldered to that respective island as traversed and in a manner positively sealing the aperture in each instance. Metal-to-metal solder content is established only between the respective metallization island 25 and the lead 23, but not against the ceramic surface. The metallizations themselves are established by brazing or the like.

Figure 10:
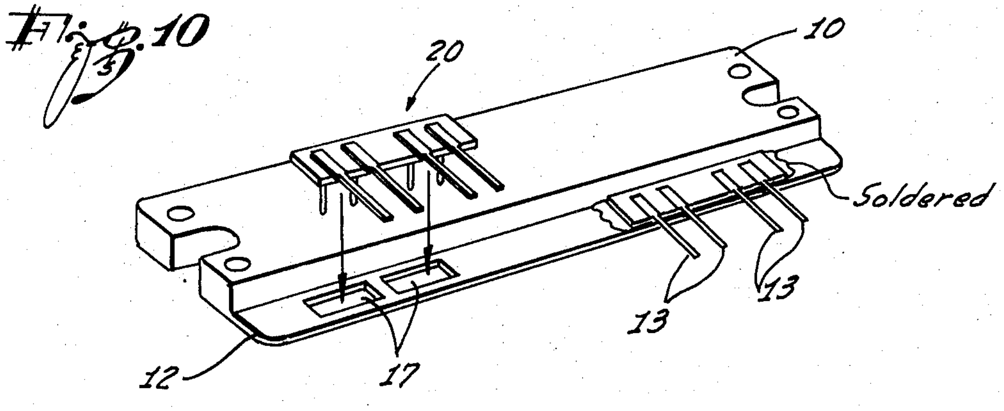
FIG. 10 is an exploded view from below of various elements as they are to be assembled as shown in FIG. 1.
Figure 12:
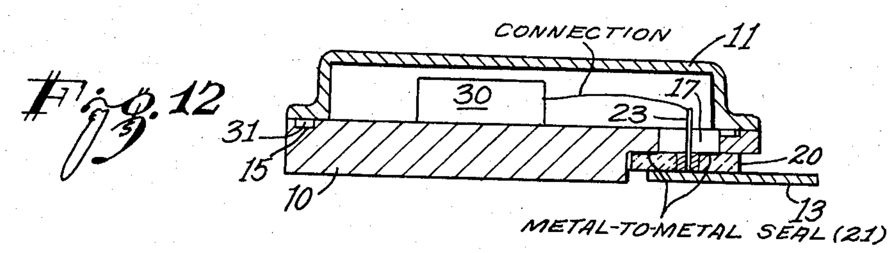
FIG. 12 is a cross section through a completed assembly as indicated by lines 12—12 in FIG. 1.
Figure 11:
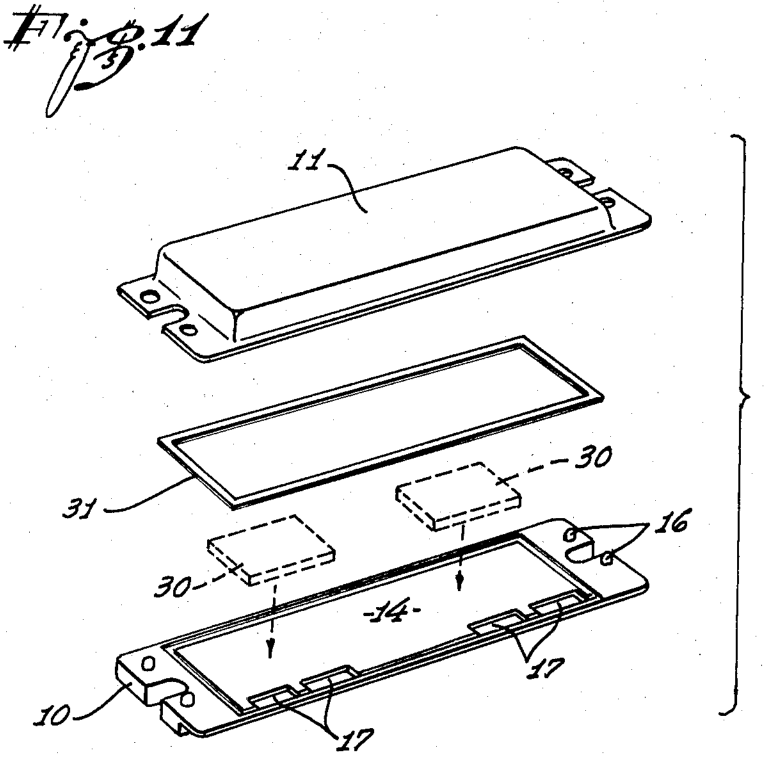
FIG. 11 is a similar exploded view from above.

Upon assembly (FIGS. 10 and 11) the wafers 20 are placed individually onto the underside of bar 12 and over the apertures 17. The metallization strips 21, 22 are soldered to the metal of bar 12, all around each pair of apertures, to provide a hermetic, metal-to-metal seal as between metallization on the wafer and base 10.

Thereupon, the leads 23 project into the space adjacent platform 14 in a completely sealed configuration.

Next, carrier wafers such as 30 are placed onto platform 14 and cemented thereto. Metallization on these wafers, establishing current leads therein, are soldered to the leads 23 in accordance with the desired circuit connection to be made.

Next, a gasket 31 made of plastic or metal, is placed on bar 10 to circumscribe the mounting space for wafers 30. The current leads 23 as projecting into platform 14 are on the inside of gasket 31. Finally, cup 11 is placed on top of base 10. The cap or cover 11 has flanging around its periphery with which to engage positively the gasket. Moreover, cover 11 has lugs 32 and 33 with apertures, and the rivets 16 project through these apertures when the cap is placed onto the base. Upon pressing cover 11 against base 10, the rivets can be flattened at the top to hold the cap tightly against the interior space now defined and housing the carrier wafers in hermetically sealed encapsulation.

The invention is not limited to the embodiments described above but all changes and modifications thereof not constituting departures from the spirit and scope of the invention are intended to be included.

I claim:

1. A mounting and hermetically sealing and encapsuling structure for miniature electronic circuit elements, which are supported on ceramic carrier wafers or the like, comprising:

a base element made of a material of high thermal conductance to serve as heat sink and having a mounting platform, the electronic circuit elements being disposed on the mounting platform; the base element further having an integral, flat bar along one side and between the end portions of the base element, the flat bar having windows;

current lead-in support members in the windows each comprised of a ceramic wafer element with peripheral metallization on one side respectively being sealed to the material of the base element where defining the respective window, each member having at least one metallized aperture, there being first, externally accessible metal current leads in the apertures connected to terminals of the electronic circuit elements as disposed on the mounting platform, the one side of the each wafer provided with a metallization island around the respective aperture in the wafer, the respective first, metal lead in the aperture connected to the metallization island;

a second external lead on the other side of the wafer and being cemented thereto as well as connected to the first lead in the aperture of the wafer;

the second external lead, the first metal lead in the aperture, the metallization lining and the island providing an electric signal path through metallic contact between them and establishing metallic sealing from one side of the wafer element to the other side; and a cover sealingly connected to the base element.

2. A mounting structure as in claim 1, the end portions of the base element having rivets, the cover having end portions with apertures, respectively receiving the rivets and being riveted to the base, the cover being flanged around the periphery for flat engagement with the base; and a sealing gasket interposed between the cover and the base and circumscribing a particular area of the mounting platform, the first metal lead of the wafer extending inside of the area and of the space when the cover is riveted to the base.

3. A mounting structure as in claim 1, the current lead being soldered to the island, to obtain the sealing of one side of the wafer element to the other.

4. A mounting and hermetically sealing and encapsuling structure for miniature electronic circuit elements, which are supported on ceramic carrier wafer or the like, comprising:

a flat metallic base element having a mounting platform and being traversed by at least one window leading from one side of the element to the other one, the platform being on the one side;

at least one electronic circuit element disposed on the platform of the element;

a current lead-in support member made of a ceramic wafer and having first and second opposite sides, the periphery of said first side of the said wafer being provided with a continuous, uninterrupted metallization, the member sealingly connected with its first side by metallic bond to the base element at the side thereof opposite the platform and covering the window, the member having an aperture with internal, metallized lining;

a current lead traversing the aperture and being isolated from the peripheral metallization and projecting from the first side of the member, and being connected electrically to said circuit element; and external lead on the second side of the member extending transverse to the current lead and covering the aperture and being connected in metal bond to the metal lining in the aperture; means in metallic bond with the lining and the current lead, but electrically isolated from said peripheral metallization, for hermetically sealing the aperture; and a cover sealingly connected to the base element above the one side for hermetically sealing space above the platform.

5. A mounting structure as in claim 4, the element being made of copper.

6. A mounting structure as in claim 4, the cover being riveted to the base element.

* * * * *